United States Patent
Martens

(10) Patent No.: US 9,753,071 B1
(45) Date of Patent: Sep. 5, 2017

(54) SYSTEM AND METHOD FOR IMPROVED RESOLUTION PULSED RADIO FREQUENCY (RF) MEASUREMENTS WITH PHASE COHERENCE

(71) Applicant: ANRITSU COMPANY, Morgan Hill, CA (US)

(72) Inventor: Jon S. Martens, San Jose, CA (US)

(73) Assignee: ANRITSU COMPANY, Morgan Hill, CA (US)

( * ) Notice: Subject to any disclaimer, the term of this patent is extended or adjusted under 35 U.S.C. 154(b) by 561 days.

(21) Appl. No.: 14/213,291

(22) Filed: Mar. 14, 2014

Related U.S. Application Data

(60) Provisional application No. 61/799,419, filed on Mar. 15, 2013.

(51) Int. Cl.
*G01R 27/28* (2006.01)
*G01R 27/32* (2006.01)

(52) U.S. Cl.
CPC .................................. *G01R 27/32* (2013.01)

(58) Field of Classification Search
CPC ...................................................... G01R 27/32
USPC .................................... 324/637, 651, 76.19
See application file for complete search history.

(56) References Cited

U.S. PATENT DOCUMENTS

| | | | |
|---|---|---|---|
| 6,211,663 B1* | 4/2001 | Moulthrop | H04B 17/20 324/615 |
| 2010/0102829 A1* | 4/2010 | Azarian | G01R 27/28 324/651 |

\* cited by examiner

*Primary Examiner* — Farhana Hoque
(74) *Attorney, Agent, or Firm* — Tucker Ellis LLP

(57) ABSTRACT

A method for obtaining improved resolution pulsed radio frequency (RF) measurements with phase coherence for a device under test (DUT) using a vector network analyzer (VNA) includes generating a pulsed RF test signal, transmitting the pulsed RF test signal to the DUT and receiving a signal from the DUT at the VNA in response to the pulsed RF test signal. An intermediate frequency (IF) signal is generated using a local oscillator (LO) signal. A phase of the LO signal is shifted by a prescribed amount while generating the IF signal. The IF signal is then sampled over multiple pulses and measurements are constructed from the measurements. A discrete Fourier transform (DFT) is then applied to the constructed measurements.

12 Claims, 3 Drawing Sheets

SYSTEM AND METHOD FOR IMPROVED RESOLUTION PULSED RADIO FREQUENCY (RF) MEASUREMENTS WITH PHASE COHERENCE

CLAIM OF PRIORITY

This application claims the benefit of priority to U.S. Provisional Application titled "SYSTEM AND METHOD FOR IMPROVED RESOLUTION PULSED RADIO FREQUENCY (RF) MEASUREMENTS WITH PHASE COHERENCE", Application No. 61/799,419, filed Mar. 15, 2013, which application is herein incorporated by reference.

TECHNICAL FIELD

The present application relates to vector network analyzers (VNAs) and pulsed radio frequency (RF) measurements using VNAs.

BACKGROUND

An approach to obtaining phase measurements on pulsed radio frequency (RF) data includes localizing the central line of the pulsed spectrum and processing normal vector network analyzer (VNA) measurements on that line. One disadvantage of this approach is that little of the RF power gets into the local line for low duty cycles. This is almost always the case for narrow pulses. In addition, for high profiling resolution, the duty cycle must get even smaller with the result being that dynamic range degrades. This approach is therefore largely unusable for effective duty cycles of less than 0.1%.

Another approach to obtaining phase measurements includes direct time domain acquisitions of intermediate frequency (IF) signals. This approach has been used to avoid the energy loss penalty and allow duty-cycle-independent processing. The minimum profiling resolution is set by the sample rate and the usual Discrete Fourier Transform (DFT) technique of processing collected data. The accuracy and sensitivity to noise of this approach degrades rapidly below about 8 samples so that the minimum profiling width with high accuracy is about 8 samples (i.e., 20 ns for a 400 MHz analog-to-digital converter (ADC) clock). This profiling width is too wide for many applications.

SUMMARY

In an embodiments a method for obtaining improved resolution pulsed radio frequency (RF) measurements with phase coherence for a device under test (DUT) using a vector network analyzer (VNA) includes generating a pulsed RF test signal, transmitting the pulsed RF test signal to the DUT and receiving a signal from the DUT at the VNA in response to the pulsed RF test signal. An intermediate frequency (IF) signal is generated using a local oscillator (LO) signal. A phase of the LO signal is shifted by a prescribed amount while generating the IF signal. The IF signal is then sampled over multiple pulses and measurements are constructed from the measurements. A discrete Fourier transform (DFT) is then applied to the constructed measurements. An analog-to-digital converter (ADC) clock for generating the pulsed RF test signal can be maintained at the same rate as the phase of the LO signal is shifted.

In an embodiment, the prescribed amount of shift in phase of the LO signal is $2\pi$. In an embodiment, the discrete Fourier transform applied to the constructed measurements a short-time discrete Fourier transform (STDFT). In an embodiment, when the phase of the LO signal is shifted by the prescribed amount, an analog-to-digital converter (ADC) clock for generating the pulsed RF test signal is maintained at the same rate.

In an embodiment, a system for obtaining improved resolution pulsed radio frequency (RF) measurements with phase coherence for a device under test (DUT), includes a pulse modulator connectable with the DUT and a vector network analyzer (VNA) connectable with the DUT and the pulse modulator. The VNA includes a processor and a non-transitory computer readable medium having instructions thereon that when executed cause the system to transmit a pulsed RF test signal to the DUT, receive a signal from the DUT at the VNA in response to the pulsed RF test signal, generate an intermediate frequency (IF) signal using a local oscillator (LO) signal, sample the generated IF signal over multiple pulses, and construct measurements from the samples of the generated IF signal. While generating the IF signal, a phase of the LO signal is shifted by a prescribed amount. A discrete Fourier transform (DFT) is then applied on the constructed measurements.

In an embodiment, the prescribed amount of shift in phase of the LO signal to $2\pi$. In an embodiment, the non-transitory computer readable medium further has instructions thereon that when executed cause the system to apply a short-time discrete Fourier transform (STDFT) to the constructed measurements. In an embodiment, when the phase of the LO signal is shifted by the prescribed amount, an analog-to-digital converter (ADC) clock for generating the pulsed RF test signal is maintained at the same rate.

In an embodiment, a non-transitory computer readable storage medium, including instructions stored thereon which when read and executed by one or more computers cause the one or more computers to transmit a pulsed RF test signal to the DUT, receive a signal from the DUT at the VNA in response to the pulsed RF test signal, generate an intermediate frequency (IF) signal using a local oscillator (LO) signal, sample the generated IF signal over multiple pulses, and construct measurements from the samples of the generated IF signal. While generating the IF signal, a phase of the LO signal is shifted by a prescribed amount. A discrete Fourier transform (DFT) is then applied on the constructed measurements.

In an embodiment, the prescribed amount of shift in phase of the LO signal to $2\pi$. In an embodiment, the non-transitory computer readable medium further has instructions thereon that when executed cause the system to apply a short-time discrete Fourier transform (STDFT) to the constructed measurements. In an embodiment, when the phase of the LO signal is shifted by the prescribed amount, an analog-to-digital converter (ADC) clock for generating the pulsed RF test signal is maintained at the same rate.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims.

It would be apparent to one of skill in the art that the present invention, as described below, may be implemented in many different embodiments of hardware, software, firmware, and/or the entities illustrated in the figures. Any actual software, firmware and/or hardware described herein is not limiting of the present invention. Thus, the operation and behavior of the present invention will be described with the understanding that modifications and variations of the embodiments are possible, given the level of detail presented herein.

Both phase information and high time resolution can be useful in some classes of pulsed RF measurements, for example measurements obtained using a VNA. Phase information and high time resolution can used, for example, to characterize overshoot on the rising edge of a pulse. Some prior techniques have used very narrowband measurements based on fine resolution RF profiling modulators but (a) the resolution is typically worse than 20 ns and (b) the measurement performance is highly dependent on duty cycle. Direct acquisition techniques that rely on acquiring data at a high intermediate frequency (IF) sample rate avoid these problems, but may not have adequate resolution depending on how data processing is done.

A Short-Time Discrete Fourier Transform (STDFT) or Limited DFT has been used for data processing where the Fourier process is applied to a limited number of samples. Usually, the minimum number of samples is four, with each sample set arranged to be one period of the IF signal, although for noise/jitter performance a minimum of eight samples may be set. For a system running with a 400 MHz analog-to-digital converter clock, for example, resolution is limited to 10-20 nanoseconds (ns).

Figure 1:
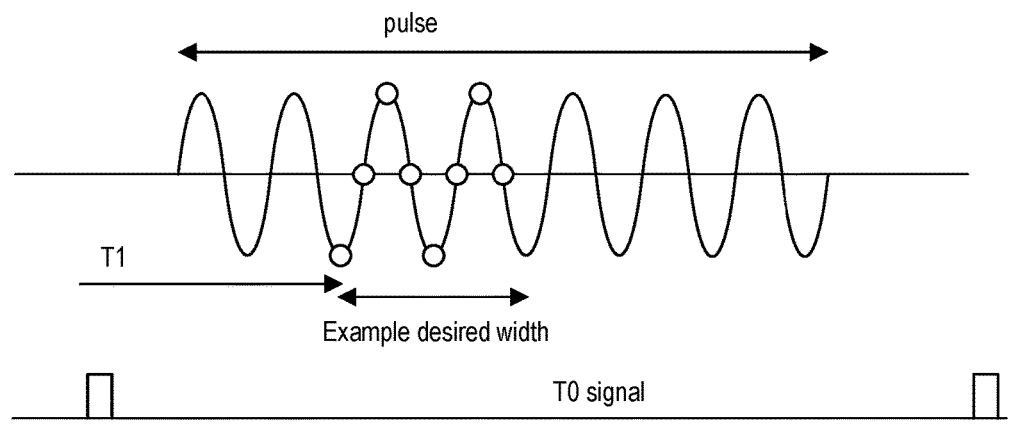
FIG. 1 illustrates a method of sampling a signal in accordance with the prior art.

Referring to FIG. 1, an eight sample process is shown. For the eight sample process, a transformed result can be expressed as $$\text{answer} = \sum_{i=1}^{8} a_i e^{-j \cdot i \cdot \pi/2}$$

where the $a_i$ are the data samples.

Embodiments of systems and methods for processing pulsed RF data in accordance with the present invention can provide improved profiling or measurement resolution while maintaining accuracy and phase information. Instead of using a DFT technique to process the IF data, dynamic nonlinear fitting is applied to an IF waveform where the parameter dependencies shift with desired resolution to get optimal accuracy. The inventor has observed resolution improvements on the order of 2-4×, for example.

Figure 2:
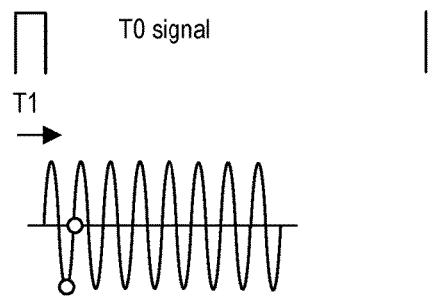
FIG. 2 illustrates a method of sampling a signal in accordance with the present invention.

Referring to FIG. 2 for additional detail of a method for processing pulsed RF data in accordance with an embodiment, to handle smaller sample counts and improve resolution, one approach can include performing a non-linear curve fit to incoming data samples. Since the mean can be removed by window averaging, an appropriate fit function can be of the form $$K(t) \cdot \sin(2\pi f t + \phi)$$

where f is the IF frequency (known and fixed), t is the time index of the sample (known), and $\phi$ and K are the fit variables. K can be treated as a constant, resulting in a single variable $\phi$, or K can be treated as a linear or more complex function of time if the data warrants, which can result in some loss of resolution advantage. When K is treated as a constant, two samples are required giving a resolution as low as 5 ns in the above example. The fitting of $\phi$ determines the phase coherence and falls out automatically from this process. Any non-linear curve fitting process, as would be known to skilled practitioners, can be used.

For greater improvement, acquisition can be altered so that the analog-to-digital converter (ADC) clock slips relative to the IF by a prescribed amount so that enough of the IF phase rotation occurs in one sample point during the time record to reconstruct the sinusoid with ratioing providing the phase reference. Additional record length is used but the measurement resolution can be one sample giving resolution improvements on the order of 5-8× over DFT techniques with comparable accuracy.

Figure 3:
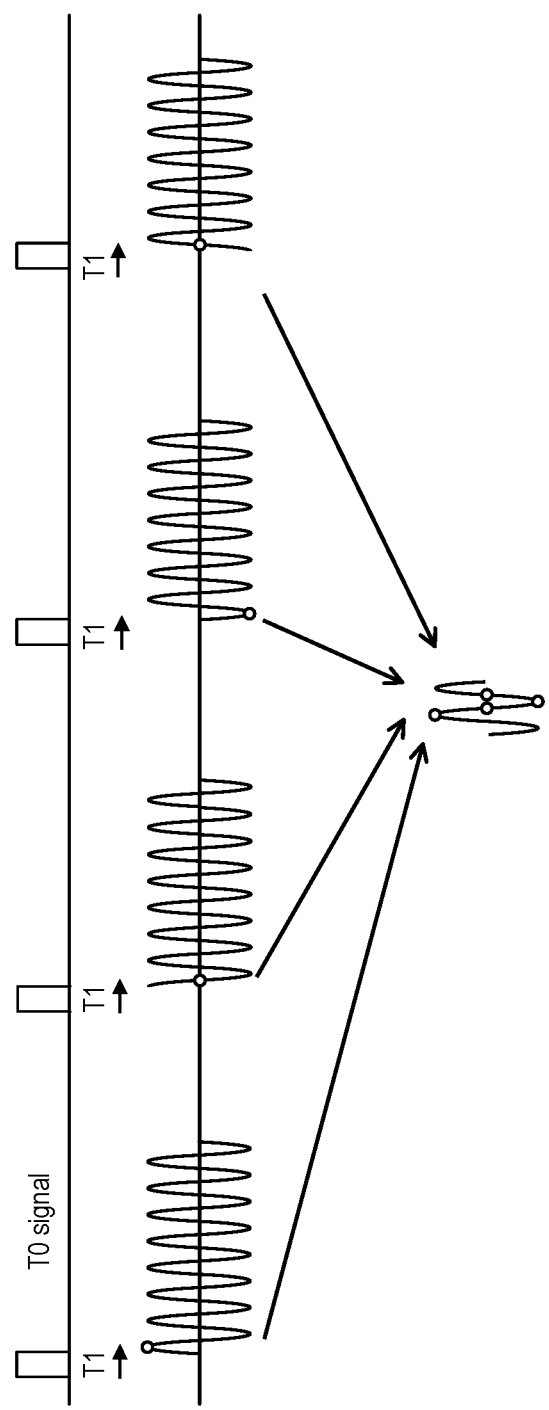
FIG. 3 illustrates another method of sampling a signal in accordance with the present invention.

Referring to FIG. 3 for additional detail of another embodiment of a method for processing pulsed RF data in accordance with the present invention, to get to even higher resolution (down to one sample), a different approach can be used. In this case, if the downconverter LO 'slips' by a prescribed amount but the ADC clock is unchanged, then enough information can be reconstructed from multiple pulses to apply STDFT.

Slip rate can be flexible, but for simplicity and maximum averaging flexibility, $2\pi$ (or some other convenient number) of slip can be introduced in a small, prescribed integer number of pulse periods (referred to herein as Q). The IF can be defined as $$IF = A \cdot \sin\left[2\pi(f_{IF} + \Delta f)t\right]$$

where $f_{IF}$ is the native IF frequency. Using the pulse repetition interval (PRI), the frequency delta can be calculated as $$2\pi \cdot \Delta f \cdot PRI = \frac{2\pi}{Q}$$

or $$\Delta f = \frac{1}{Q \cdot PRI}$$

The value Q can be chosen such that the amount of slip is small relative to the available IF bandwidth of the system. The rational relationship between the frequency shift and the pulse period ensures the phase coherence of the measurement.

The ADC sampling rate is not changed since change can affect data transport layers and other clocking aspects of a system. Only the downconverters of the receiver are altered and in a way that either only slightly perturbs the total IF response pattern or that can be easily corrected therein.

Figure 4:
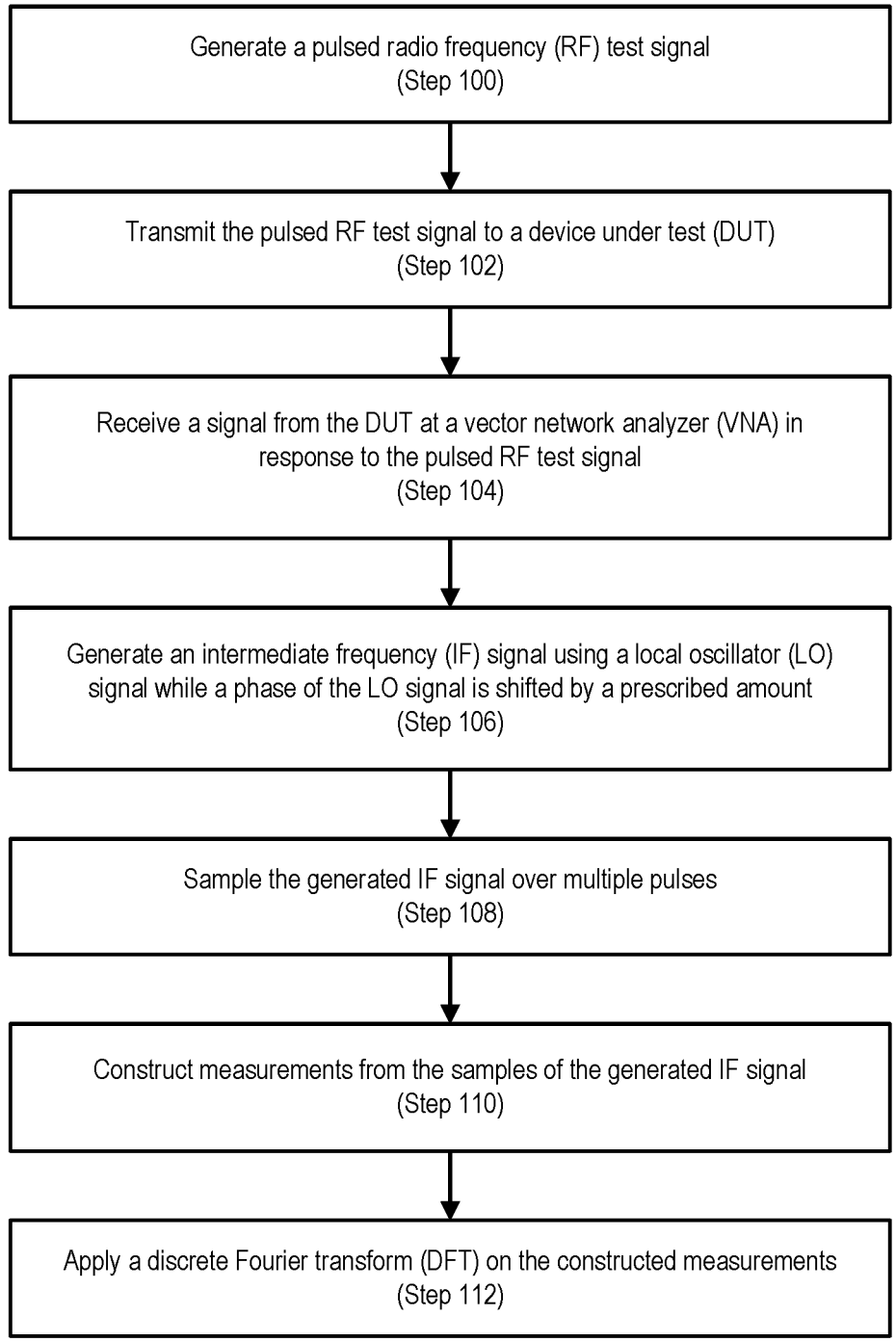
FIG. 4 is a flowchart illustrating an embodiment of a method for obtaining improved resolution pulsed radio frequency (RF) measurements with phase coherence for a device under test (DUT) using a vector network analyzer (VNA) in accordance with the present invention.

FIG. 4 is a flowchart illustrating an embodiment of a method for obtaining improved resolution pulsed radio frequency (RF) measurements with phase coherence for a device under test (DUT) using a VNA. As used herein, a DUT collectively and broadly refers to a device, system, network, or other component or components of an electrical system. The method comprises generating a pulsed RF test signal (Step 100), transmitting the pulsed RF test signal to the DUT (Step 102), and receiving a signal from the DUT at the VNA in response to the pulsed RF test signal (Step 104). The method further comprises generating an intermediate frequency (IF) signal using a local oscillator (LO) signal, wherein while generating the IF signal, a phase of the LO signal is shifted by a prescribed amount (Step 106), sampling the generated IF signal over multiple pulses (Step 108), constructing measurements from the samples of the generated IF signal (Step 110), and applying a discrete Fourier transform (DFT) on the constructed measurements (Step 112).

In some embodiments, the present invention includes a computer program product which is a non-transitory storage medium or computer readable medium (media) having instructions stored thereon/in which can be used to program a computer to perform any of the processes of the present invention. Examples of the storage medium can include, but is not limited to, any type of disk including floppy disks, optical discs, DVD, CD-ROMs, microdrive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A method for obtaining radio frequency (RF) measurements for a device under test (DUT) using a vector network analyzer (VNA), comprising:
   generating a pulsed RF test signal;
   transmitting the pulsed RF test signal to the DUT;
   receiving a RF signal in response to the pulsed RF test signal;
   generating an intermediate frequency (IF) signal by downconverting the RF signal received in response to the pulsed RF test signal using a local oscillator (LO) signal;
   shifting a phase per unit time change of the LO signal by a prescribed amount over multiple pulses of the pulsed RF test signal for a frequency of the pulsed RF test signal;
   sampling the generated IF signal at each of the multiple pulses to obtain a sample set for the frequency of the pulsed RF test signal;
   constructing measurements from the sample set; and
   applying a discrete Fourier transform (DFT) on the measurements constructed from the sample set.

2. The method of claim 1, wherein the prescribed amount of shift in the phase per unit time change of the LO signal is $2\pi$.

3. The method of claim 1, wherein the discrete Fourier transform applied to the constructed measurements a short-time discrete Fourier transform (STDFT).

4. The method of claim 1, wherein when the phase per unit time change of the LO signal is shifted by the prescribed amount, an analog-to-digital converter (ADC) clock for generating the pulsed RF test signal is maintained at the same rate.

5. A system for obtaining radio frequency (RF) measurements for a device under test (DUT), comprising:
   a pulse modulator connectable with the DUT;
   a vector network analyzer (VNA) connectable with the DUT and the pulse modulator;
   wherein the VNA includes a processor and a non-transitory computer readable storage medium having instructions thereon that when executed cause the system to
   generate a pulsed RF test signal;
   transmit the pulsed RF test signal to the DUT;
   receive a RF signal in response to the pulsed RF test signal;
   generate an intermediate frequency (IF) signal by downconverting the RF signal received in response to the pulsed RF test signal using a local oscillator (LO) signal;
   shift a phase per unit time change of the LO signal by a prescribed amount over multiple pulses of the pulsed RF test signal for a frequency of the pulsed RF test signal;
   sample the generated IF signal at each of the multiple pulses to obtain a sample set for the frequency of the pulsed RF test signal;
   construct measurements from the sample set; and
   apply a discrete Fourier transform (DFT) on the measurements constructed from the sample set.

6. The system of claim 5, wherein the prescribed amount of shift in phase per unit time change of the LO signal is $2\pi$.

7. The system of claim 5, wherein the non-transitory computer readable storage medium further has instructions thereon that when executed cause the system to apply a short-time discrete Fourier transform (STDFT) to the constructed measurements.

8. The system of claim 5, wherein when the phase per unit time change of the LO signal is shifted by the prescribed amount an analog-to-digital converter (ADC) clock for generating the pulsed RF test signal is maintained at the same rate.

9. A non-transitory computer readable storage medium, including instructions stored thereon which when read and executed by one or more computers cause the one or more computers to perform the steps comprising:
   generating a pulsed RF test signal;
   transmitting the pulsed RF test signal to a device under test (DUT);
   receiving a RF signal in response to the pulsed RF test signal;
   generating an intermediate frequency (IF) signal by downconverting the RF signal received in response to the pulsed RF test signal using a local oscillator (LO) signal;
   shifting a phase per unit time change of the LO signal by a prescribed amount over multiple pulses of the pulsed RF test signal for a frequency of the pulsed RF test signal;
   sampling the generated IF signal at each of the multiple pulses to obtain a sample set for the frequency of the pulsed RF test signal;
   constructing measurements from the sample set; and applying a discrete Fourier transform (DFT) on the measurements constructed from the sample set.

10. The non-transitory computer readable storage medium of claim 9, wherein the prescribed amount of shift in phase per unit time change of the LO signal is $2\pi$.

11. The non-transitory computer readable storage medium of claim 9, wherein the DFT applied is a short-time discrete Fourier transform (STDFT).

12. The non-transitory computer readable storage medium of claim 9, wherein when the phase per unit time change of the LO signal is shifted by the prescribed amount an analog-to-digital converter (ADC) clock for generating the pulsed RF test signal is maintained at the same rate.

* * * * *